(12) United States Patent
Shim (10) Patent No.: US 9,190,175 B2
(45) Date of Patent: Nov. 17, 2015

(54) SELF-REPAIR DEVICE

(71) Applicant: SK hynix Inc., Icheon-si Gyeonggi-do (KR)

(72) Inventor: Young Bo Shim, Dangjin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 104 days.

(21) Appl. No.: 14/085,134

(22) Filed: Nov. 20, 2013

(65) Prior Publication Data

US 2015/0074494 A1 Mar. 12, 2015

(30) Foreign Application Priority Data

Sep. 12, 2013 (KR) ........................ 10-2013-0109649

(51) Int. Cl.
G11C 29/00 (2006.01)

(52) U.S. Cl.
CPC ................................. *G11C 29/787* (2013.01)

(58) Field of Classification Search
CPC .. G11C 29/787; G11C 29/846; G11C 29/838; G11C 29/84; G11C 29/785; G11C 29/702; G11C 2029/4402; G11C 17/14; G11C 17/18; G11C 29/44; G11C 29/4401; G11C 29/72; G11C 2029/0405; G06F 11/1016; H01L 27/101; H01L 2924/0002; H01L 2924/00
See application file for complete search history.

(56) References Cited

U.S. PATENT DOCUMENTS

| | | | | | |
|---|---|---|---|---|---|
| 5,642,316 | A | * | 6/1997 | Tran et al. | 365/200 |
| 5,748,543 | A | * | 5/1998 | Lee et al. | 365/200 |
| 5,889,710 | A | * | 3/1999 | Pascucci | 365/200 |
| 5,920,515 | A | * | 7/1999 | Shaik et al. | 365/200 |
| 5,966,333 | A | * | 10/1999 | Otani et al. | 365/200 |
| 6,115,828 | A | * | 9/2000 | Tsutsumi et al. | 714/6.32 |
| 6,367,042 | B1 | | 4/2002 | Phan et al. | |
| 6,668,344 | B1 | * | 12/2003 | Sakata et al. | 714/710 |
| 6,788,596 | B2 | | 9/2004 | Kim et al. | |
| 8,310,888 | B2 | * | 11/2012 | Bang et al. | 365/200 |
| 2003/0147291 | A1 | * | 8/2003 | Kim et al. | 365/200 |
| 2003/0237033 | A1 | * | 12/2003 | Borri et al. | 714/718 |
| 2005/0055173 | A1 | * | 3/2005 | Eustis et al. | 702/118 |
| 2005/0237830 | A1 | * | 10/2005 | Kim et al. | 365/200 |
| 2006/0221729 | A1 | * | 10/2006 | Iwai et al. | 365/200 |
| 2007/0047347 | A1 | | 3/2007 | Byun et al. | |
| 2007/0113121 | A1 | * | 5/2007 | Hummler | 714/710 |
| 2008/0186783 | A1 | * | 8/2008 | Kang | 365/200 |
| 2009/0168570 | A1 | * | 7/2009 | Park | 365/200 |
| 2012/0120733 | A1 | * | 5/2012 | Son et al. | 365/189.02 |
| 2012/0155202 | A1 | * | 6/2012 | Kong | 365/200 |
| 2012/0195144 | A1 | * | 8/2012 | Ide et al. | 365/200 |
| 2013/0031319 | A1 | * | 1/2013 | Gorman et al. | 711/157 |

* cited by examiner

*Primary Examiner* — Guerrier Merant
(74) *Attorney, Agent, or Firm* — William Park & Associates Ltd.

(57) ABSTRACT

A self-repair device includes an ARE (array rupture electrical fuse) array block configured to store fail addresses; an ARE control block configured to control a repair operation of fuse sets according to the fail addresses, compare a plurality of the fail addresses, and determine a failed state; and a redundancy block configured to store fuse data of the fail addresses, compare an input address with the fail addresses, and control row and column redundancy operations.

25 Claims, 6 Drawing Sheets

SELF-REPAIR DEVICE

CROSS-REFERENCES TO RELATED APPLICATION

The present application claims priority under 35 U.S.C. §119(a) to Korean application number 10-2013-109649, filed on Sep. 12, 2013, in the Korean Intellectual Property Office, which is incorporated herein by reference in its entirety.

BACKGROUND

1. Technical Field

Various embodiments relate to a self-repair device, and more particularly, to a technology for improving the repair efficiency and reducing the area of a semiconductor device including a fuse array.

2. Description of Related Art

In general, a semiconductor memory device includes a is number of memory cells. As processing technologies have been developed and thus the degree of integration is augmented, the number of memory cells gradually increases. If a fail occurs in even any one among memory cells, a corresponding semiconductor memory device mis-operates. Therefore, since the semiconductor memory device including a failed cell cannot perform a desired operation, it should be discarded.

However, recently, as processing technologies for manufacturing semiconductor memory devices have been further developed, fails occur probabilistically in only a small number of memory cells. When considering the yield of a product, it is inefficient to discard entire semiconductor memory devices as failed products due to a small number of fails. Thus, in order to cope with this problem, not only normal memory cells but also redundancy memory cells are provided in a semiconductor memory device.

That is to say, a redundancy control circuit is used to perceive in advance the occurrence of a fail through a test and then convert connection to a cell where the fail has occurred into connection to a cell included in a redundancy circuit, when an access to the corresponding cell is requested. The redundancy circuit refers to a set of redundancy memory cells which are separately prepared in addition to normal memory cells and are used as replacement cells of cells in which fails occur.

Redundancy memory cells form a circuit which is provided to is repair failed memory cells (hereinafter, referred to as "memory cells to be repaired") in the case where fails occur in normal memory cells.

In detail, for example, in the case where a memory cell to be repaired is accessed in read and write operations, not the memory cell to be repaired but a memory cell which operates normally is internally accessed. The memory cell accessed in this way is a redundancy memory cell.

Accordingly, when an address corresponding to a memory cell to be repaired is inputted, a semiconductor memory device performs an operation (hereinafter, referred to as "a repair operation") for accessing not the memory cell to be repaired but a redundancy memory cell. Through such a repair operation, the semiconductor memory device is ensured with a normal operation.

In order to perform the repair operation, a semiconductor memory device needs not only redundancy memory cells but also other circuit configurations. One of these circuit configurations is a repair fuse circuit. The repair fuse circuit is to store an address corresponding to a memory cell to be repaired (hereinafter, referred to as "an address to be repaired").

The repair fuse circuit programs an address to be repaired, to fuses. A semiconductor device performs the repair operation using the address to be repaired, which is programmed in this way.

As a net die increases and it is complicated to realize a column redundancy control circuit, an existing self-repair device is performs only a row repair operation. According to this fact, since it is impossible to repair a column-related fail, a repair success rate becomes poor.

Also, in a conventional self-repair device, in order to perform a self-repair operation, an ARE (array rupture electrical fuse) array reads the fuse regions of respective banks. After partial fuse sets which have not been used in the fuse regions are loaded in advance on fuse registers, a memory is tested.

If a failed address occurs as a result of a test, a fuse register of a bank corresponding to the failed address selects a fuse set stored therein and transmits the selected fuse set to the ARE array, and then a repair operation is performed. In this regard, in order to store the information of fuse sets, a number of fuse registers are needed for the fuse regions of the respective banks.

SUMMARY

A self-repair device which performs a repair operation using an appropriate redundancy according to address information on failed bits of a semiconductor device, thereby improving repair efficiency, is described herein.

In an embodiment of the invention, a self-repair device includes: an ARE (array rupture electrical fuse) array block configured to store fail addresses; an ARE control block configured to control a repair operation of fuse sets according to the fail addresses, compare a plurality of the fail addresses, and determine a failed state; and a is redundancy block configured to store fuse data of the fail addresses, compare an input address with the fail addresses, and control row and column redundancy operations.

In an embodiment of the invention, a self-repair device includes: an ARE (array rupture electrical fuse) control block configured to be inputted with fail address information from a memory tester and control a rupture operation for electrical fuses; an ARE array block configured to store information on respective bits of the fail addresses; and a redundancy block configured to perform a redundancy operation in response to a row clock, a column clock, row fuse data, column fuse data, a row address, a column address, and counting signals.

According to various embodiments of the disclosure, the following advantages are provided.

First, when two or more cells fail internally of a memory in a test, a repair operation may be performed by selecting an appropriate row fuse set or column fuse set by determining whether the fails are row-related fails, column-related fails or random fails, whereby a repair success rate may be increased.

Second, fuse sets not used in the fuse regions of respective banks are not loaded on fuse registers before a test, and instead only non-used fuse sets in the fuse regions of banks are loaded and used on the basis of the information of failed banks, failed row addresses or failed column addresses after a test, whereby it is possible to is decrease the number of fuse registers for storing fuse sets and reduce a layout area.

BRIEF DESCRIPTION OF THE DRAWINGS

Features, aspects, and embodiments are described in conjunction with the attached drawings, in which.

DETAILED DESCRIPTION

Hereinafter, a self-repair device according to the invention will be described below with reference to the accompanying drawings through various embodiments.

As the sizes of respective elements constituting a is semiconductor integrated circuit device gradually decrease and the number of elements included in one semiconductor chip gradually increases, the level of defect density rises. The rise in defect density is a direct factor that lowers the yield of a semiconductor device. If the defect density markedly increases, a wafer on which semiconductor devices are formed should be discarded.

In order to decrease the defect density, a redundancy circuit which replaces defective cells with redundancy cells has been suggested. In the case of a semiconductor memory device, a redundancy circuit (or a fuse circuit) may be used for each of a row-related line (for example, a word line) and a column-related line (for example, a bit line).

Such a redundancy circuit includes a fuse array which stores the address information of failed cells. The fuse array is constituted by a plurality of fuse sets which include a plurality of fuse lines. Each fuse set programs information in such a way as to melt fuses by applying overcurrent. Self-repair (or self-rupture) is performed to repair a bit fail in the packed state of a memory.

Figure 1:
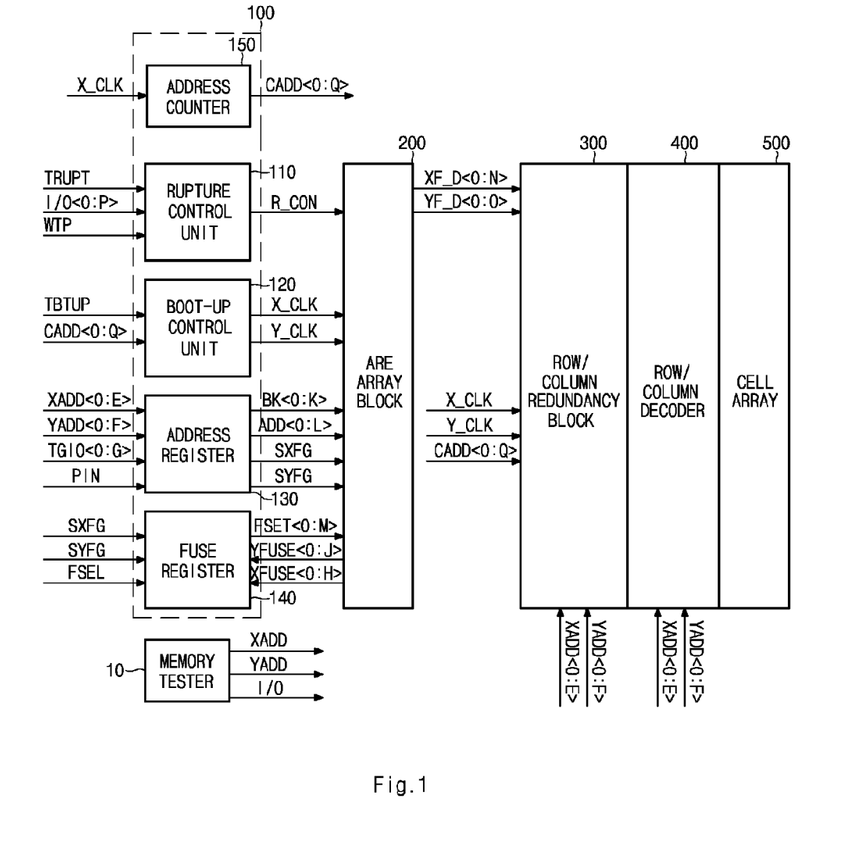
FIG. 1 is a configuration diagram of a self-repair device in accordance with an embodiment of the present disclosure.

FIG. 1 is a configuration diagram of a self-repair device in to accordance with an embodiment of the present disclosure.

A self-repair device in accordance with an embodiment of the present disclosure includes a memory tester 10, an ARE (array rupture electrical fuse) control block 100, an ARE array block 200, a row/column redundancy block 300, a row/column decoder 400, and a cell array 500. The ARE control block 100 includes a rupture control unit 110, a boot-up control unit 120, an address register 130, a fuse register 140, and an address counter 150.

The memory tester 10 is configured to temporarily store information on the fail addresses which occur while testing a memory. Further, the memory tester 10 may be configured to output the fail addresses and rupture data I/O<0:P> to the rupture control unit 110 in the ARE control block 100 and output a row address XADD and a column address YADD to the address register 130 in the ARE control block 100. The rupture data I/O<0:P> includes the row address XADD, the column address YADD, bank information, flag information, and fuse set information of failed cells.

The ARE control block 100 is configured to be inputted with fail address information from the memory tester 10 and control a rupture operation for electrical fuses provided in the ARE array block 200. In detail, the rupture control unit 110 may be configured to store rupture data and output a rupture control signal R_CON for controlling the rupture operation of the ARE array block 200, to the ARE array block 200 according to a rupture signal TRUPT, a write signal WTP and the rupture data I/O<0:P>. The ARE control block 100 may be configured to control a repair operation of fuse sets according to fail addresses, compare a plurality of the fail addresses in a test mode, and determine a failed state.

The write signal WTP is a pulse which is generated by a write is command in the rupture operation. When the write signal WTP is activated, the rupture data I/O<0:P> may be stored in registers which are provided in the rupture control unit 110.

That is to say, the rupture control unit 110 may control the rupture operation for the electrical fuses included in the ARE array block 200, on the basis of the fail address inputted from the external memory tester 10 when the rupture signal TRUPT is activated, according to the rupture control signal R_CON. The rupture control signal R_CON includes bank information, address information, flag information, and fuse set information.

The boot-up control unit 120 is configured to start a boot-up operation according to a boot-up control signal TBTUP and output a row clock X_CLK and a column clock Y_CLK to the ARE array block 200 and the row/column redundancy block 300 according to counting signals CADD<0:Q>. The boot-up control unit 120 controls fuse data for the fail address stored in the electrical fuses of the ARE array block 200, to be outputted to the row/column redundancy block 300.

In other words, the boot-up control unit 120 controls fuse data for the fail address stored in the electrical fuses of the ARE array block 200, to be outputted to the row/column redundancy block 300 before the memory operates after a power-up operation. Information on row or column fuses ruptured in the ARE array block 200 is outputted to the row/column redundancy block 300 according to the row clock X_CLK and the column clock Y_CLK.

The boot-up control unit 120 in accordance with an embodiment of the disclosure searches respective fuse regions in all banks of the ARE array block 200 in the boot-up operation. Information on partial non-used fuse sets is loaded in the fuse register 140 of each bank which is provided in advance.

In an embodiment of the disclosure, while the rupture signal TRUPT and the boot-up control signal TBTUP are signals which are applied from an outside, they may be automatically generated internally of the memory.

The ARE array block 200 is configured to be inputted with a bank address BK<0:K>, a row flag signal SXFG, a column flag signal SYFG and an address ADD<0:L> from the address register 130 and be inputted with fuse set signals FSET<0:M> from the fuse register 140. The ARE array block 200 is configured to output a row fuse address XFUSE<0:H> and a column fuse address YFUSE<0:J> to the fuse register 140 and output row fuse data XF_D<0:N> and column fuse data YF_D<0:O> to the row/column redundancy block 300.

The ARE array block 200 is a memory which stores to information on the respective bits of all fail addresses. The ARE array block may be configured to store fail addresses in a plurality of fuse sets. Information on the addresses of all fails which occur when testing the memory is temporarily stored in the memory tester 10.

When the testing of the memory is completed, the ARE array block 200 may apply the information to the memory, and electrical fuses corresponding to respective bits may be ruptured in the ARE array block 200, by which the fail information is permanently stored. The ARE array block 200 may output the row fuse data XF_D<0:N> and the column fuse data YF_D<0:O> of the failed addresses which are stored before the memory may operate after the power-up operation when the boot-up control signal TBTUP may be activated, to the row/column redundancy block 300.

The row fuse data XF_D<0:N> includes information on ruptured row fuses. The ARE array block 200 outputs the row fuse data XF_D<0:N> to the row redundancy block 300 in synchronization with the row clock X_CLK. The column fuse data YF_D<0:O> includes information on ruptured column fuses. The ARE array block 200 outputs the column fuse data YF_D<0:O> to the column redundancy block 300 in synchronization with the column clock Y_CLK.

The address register 130 is configured to be inputted with a row address XADD<0:E>, a column address YADD<0:F>, information of global input/output lines TGIO<0:G> and a control signal PIN, and output the bank address BK<0:K>, the row flag signal SXFG, the column flag signal SYFG and the address ADD<0:L> to the ARE array block 200.

The row address XADD<0:E> is inputted together with an active command of the memory. The column address YADD<0:F> is inputted together with a read/write command of the memory.

The address register 130 stores information on a bank address, the row address XADD<0:E> and the column address YADD<0:F> corresponding to a fail cell, according to the control signal PIN when a fail has occurred during a testing operation of the memory, to perform a self-repair operation. The information on the global input/output lines TGIO<0:G> includes information on a bank address corresponding to the fail cell and information on fail or pass. The address register 130 may store fail address when a control signal is activated, in a case where levels of the global input/output lines TGIO<0:G> are a first logic level in the test mode.

The control signal PIN is a pulse signal for controlling a pipe register input part to store the data loaded on the global input/output lines TGIO<0:G> in the course of transferring the information on pass or fail of a cell to a data output buffer in the read operation of the memory, in a pipe register. The address register 130 stores fail address information in registers when the control signal PIN is activated.

The address register 130 outputs the address ADD<0:L> to the ARE array block 200 for the rupture operation for a fail cell. The to address ADD<0:L> includes information on the row address or the column address of a fail cell which is stored in the address register 130 in the test mode.

The fail address is included in the information applied from the global input/output lines TGIO<0:G>. The global input/output lines TGIO<0:G> are global data lines which transfer data in a specified test mode. In an embodiment of the disclosure, the specified test mode is entered when performing self-repair, and bank information is loaded on global input/output lines TGIO. However, an embodiment of the disclosure is not limited to such, and it is to be noted that a specified test mode may not be entered and the bank information inputted together with the active command may be used.

While the bank address BK<0:K> is inputted together with the active command in a normal operation, it is loaded on the global input/output lines TGIO<0:G> in a specified test mode. For example, in a read operation, data of a logic high level may be transferred to the global input/output lines TGIO<0:G> when an accessed cell is a pass, and data of a logic low level are loaded on the global input/output lines TGIO<0:G> when an accessed cell is a fail. The global input/output lines TGIO<0:G> may transfer such fail address information to the address register 130 and at the same time transfer pass or fail information of a cell to the data output buffer.

The fuse register 140 may output the fuse set signals FSET<0:M> to the ARE array block 200 according to the row flag signal SXFG, the column flag signal SYFG, a fuse set select signal FSEL, the row fuse address XFUSE<0:H> and the column fuse address YFUSE<0:J>.

The fuse register 140 reads the data stored in the respective regions of the ARE array block 200 and loads and stores information on non-used fuse sets in correspondence to fail cell information, to perform a self-repair operation for a fail address. The row fuse address XFUSE<0:H> includes information on non-used row fuse sets in the ARE array block 200. The column fuse address YFUSE<0:J> includes information on non-used column fuse sets in the ARE array block 200. The fuse register 140 outputs the fuse set signals FSET<0:M> including information on a fuse set to rupture in correspondence to a fail address, to the ARE array block 200.

The address counter 150 is configured to count the row clock X_CLK and output the counting signals CADD<0:Q> to the boot-up control unit 120 and the row/column redundancy block 300. Namely, the counting signals CADD<0:Q> represent an address which is generated in the address counter 150 due to toggling of the row clock X_CLK in the boot-up operation.

The row/column redundancy block 300 is configured to perform a redundancy operation corresponding to fail data, according to the row clock X_CLK, the column clock Y_CLK, the row fuse data XF_D<0:N>, the column fuse data YF_D<0:O>, the row address XADD, the column address YADD and the counting signals CADD<0:Q>. That is to say, the row/column redundancy block 300 performs a row redundancy operation in correspondence to the row fuse data XF_D<0:N> according to the row clock X_CLK. Further, the row/column redundancy block 300 performs a column redundancy operation in correspondence to the column fuse data YF_D<0:O> according to the column clock Y_CLK. Accordingly, the row/column redundancy block 300 may be configured to store fuse data of the fail addresses applied from the ARE array block 200, compare an input address with the fail addresses, and control row and column redundancy operations.

The row/column redundancy block 300 is loaded with and stores the row fuse data XF_D<0:N> and the column fuse data YF_D<0:O> of respective fail addresses of which electrical fuses have been already ruptured, from the ARE array block 200 before the memory operates. The row/column redundancy block 300 compares an address which is inputted when the memory operates and an already stored address, and enables a normal row (or column) or a spare row (or column). Accordingly, the row/column redundancy block 300 may be configured to store in advance bit information of the failed addresses in a test operation at a package level, compare an address inputted in an operation of a memory and the stored bit information of the failed addresses, and perform a redundancy operation.

The row/column decoder 400 is configured to decode the row address XADD and the column address YADD and controls operations for the row and column lines of the cell array 500.

Figure 2:
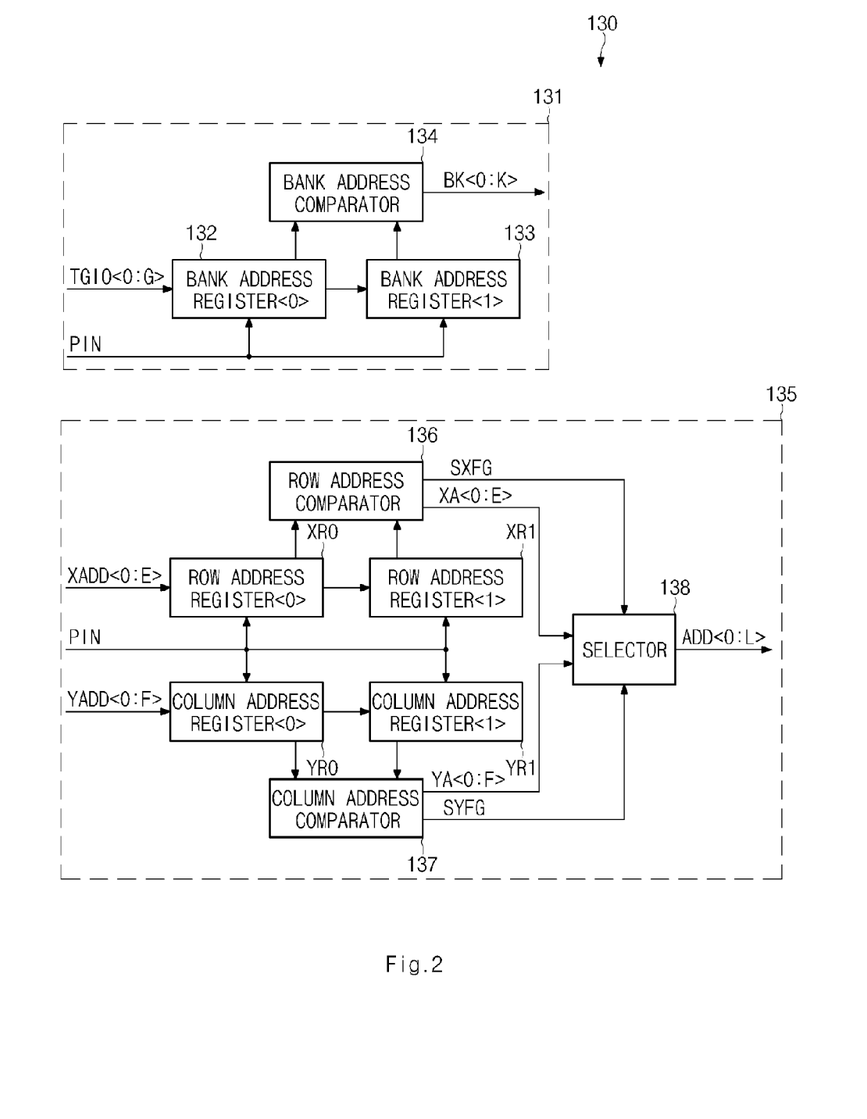
FIG. 2 is a detailed configuration diagram of the address register of FIG. 1.

FIG. 2 is a detailed configuration diagram of the address register 130 of FIG. 1.

The address register 130 includes a bank address control is section 131 and an address control section 135.

The bank address control section 131 includes bank address registers 132 and 133 and a bank address comparator 134. The bank address registers 132 and 133 are configured to store the fail address information of the global input/output lines TGIO<0:G> in correspondence to the control signal PIN. The bank address control section 131 may be configured to store bank addresses of failed cells when the control signal PIN is activated. Further, the bank address comparator 134 is configured to compare the outputs of the bank address registers 132 and 133 and output the bank address BK<0:K> to the ARE array block 200.

The address control section 135 includes row address registers XR0 and XR1, a row address comparator 136, column address registers YR0 and YR1, a column address comparator 137, and a selector 138.

The row address registers XR0 and XR1 are configured to store the row address XADD<0:E> of failed cells applied from the global input/output lines TGIO<0:G> in correspondence to the control signal PIN. The row address comparator 136 is configured to compare the outputs of the row address registers XR0 and XR1 and output the row flag signal SXFG and row comparison signals XA<0:E>.

The column address registers YR0 and YR1 are configured to store the column address YADD<0:F> of failed cells applied from the is global input/output lines TGIO<0:G> in correspondence to the control signal PIN. The column address comparator 137 is configured to compare the outputs of the column address registers YR0 and YR1 and output the column flag signal SYFG and column comparison signals YA<0:F>. The selector 138 is configured to select any ones of the row comparison signals XA<0:E> and the column comparison signals YA<0:F> according to the row flag signal SXFG or the column flag signal SYFG, and output the address ADD<0:L> to the ARE array block 200.

In other words, when the row flag signal SXFG is activated, the selector 138 may select the row comparison signals XA<0:E> and output the address ADD<0:L>. Conversely, when the column flag signal SYFG is activated, the selector 138 may select the column comparison signals YA<0:F> and output the address ADD<0:L>. Accordingly, the address control section 135 may be configured to store addresses of failed cells applied when the control signal PIN is activated, compare at least two addresses, and output a row address or a column address.

Figure 3:
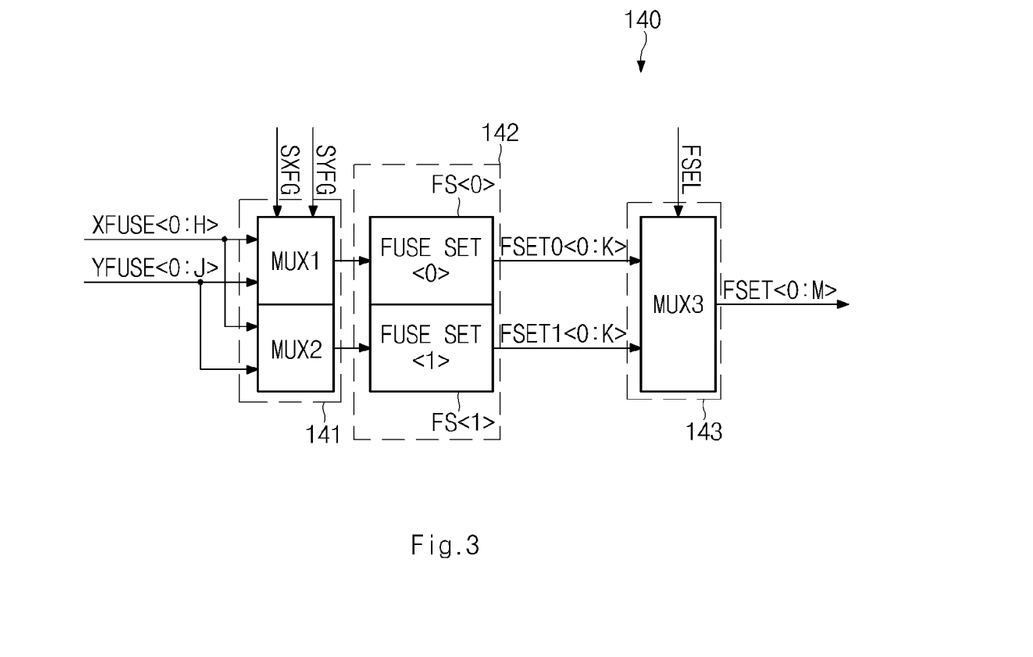
FIG. 3 is a detailed configuration diagram of the fuse register of FIG. 1.

FIG. 3 is a detailed configuration diagram of the fuse register 140 of FIG. 1.

The fuse register 140 includes a row column selecting section 141, a fuse set array section 142, and a fuse set selecting section 143.

The row column selecting section 141 is configured to select and output any one of the row fuse address XFUSE<0:H> and the column fuse address YFUSE<0:J> applied from the ARE array block 200 according to the row flag signal SXFG or the column flag signal SYFG. The row column selecting section 141 includes a plurality of selectors, and the selectors may include multiplexers MUX1 and MUX2.

The fuse set array section 142 includes a fuse set FS<0> and a fuse set FS<1>. The fuse set FS<0> and the fuse set FS<1> store the row fuse address XFUSE<0:H> or the column fuse address YFUSE<0:J> which is applied from the row column selecting section 141 and may be outputted from the selector 138. The fuse set FS<0> outputs fuse set signals FSET0<0:K> to the fuse set selecting section 143 which may include a multiplexer MUX3. The fuse set FS<1> outputs fuse set signals FSET1<0:K> to the fuse set selecting section 143.

The fuse set selecting section 143 is configured to select any ones of the fuse set signals FSET0<0:K> and the fuse set signals FSET1<0:K> according to the fuse set select signal FSEL, and output the fuse set signals FSET<0:M> to the ARE array block 200.

Figure 4:
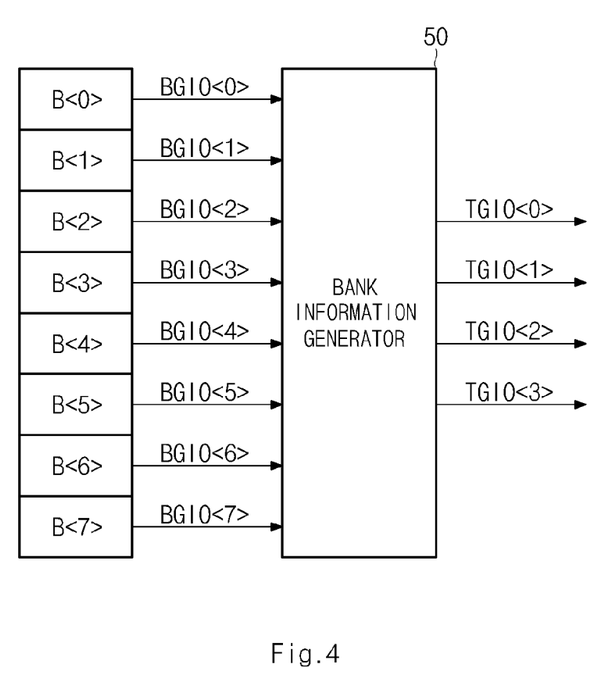
FIG. 4 is a diagram explaining operations of a bank information generator which generates the information of the global input/output lines of FIG. 1.

FIG. 4 is a diagram explaining operations of a bank information generator 50 which generates the information of the global input/output lines TGIO<0:G>.

In an embodiment of the disclosure, it will be exemplarily described that eight banks B are used. A bank group includes the eight banks B<0:7>, and each bank B includes the cell array 500 of FIG. 1. Bank signals BGIO<0:7> from the eight banks B are outputted to a bank information generator 50. The bank signals BGIO<0:7> include pass and fail information that includes information on the states of the respective eight banks B.

The bank information generator 50 is configured to be inputted with the bank signals BGIO<0:7> and output bank information and bank fail information to global input/output lines TGIO<0:3>. The three global input/output lines TGIO<0:2> are lines on which information on banks failed among the eight banks B is loaded. The remaining one global input/output line TGIO<3> is a line on which a flag signal indicating the fail of a certain bank among the eight banks B when the bank has failed is loaded.

The bank information generator 50 may encode the bank signals BGIO<0:7> when a fail occurs in a certain bank among the eight banks B<0:7>, output the values of the bits thereof to the global input/output lines TGIO<0:2>, and output a flag signal indicating the occurrence of the fail to the global input/output line TGIO<3>. The bank information and the bank fail information applied to the global input/output lines TGIO<0:3> may be outputted to the address register 130.

Figure 5:
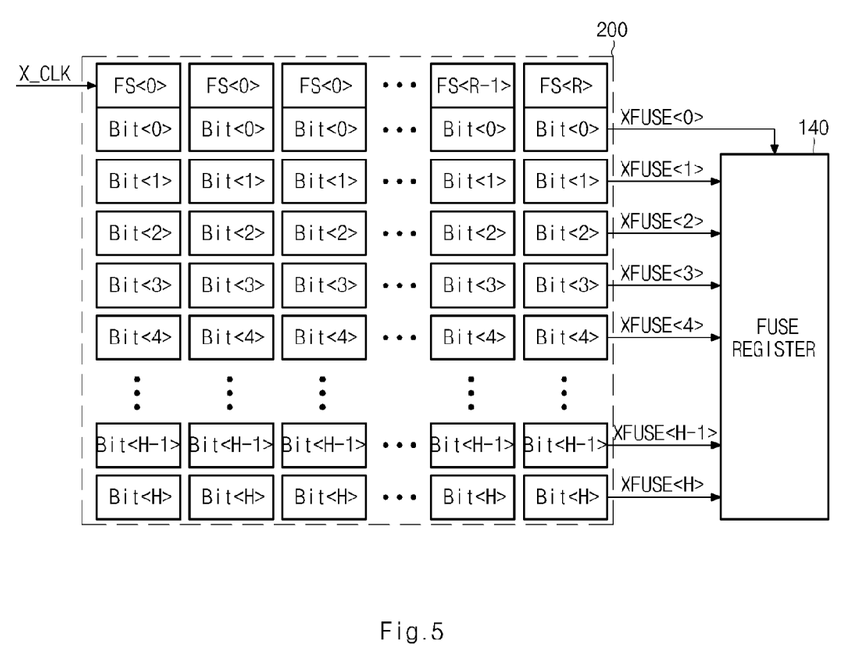
FIG. 5 is a detailed configuration diagram of the ARE array block of FIG. 1.

FIG. 5 is a detailed configuration diagram of the ARE array block 200 of FIG. 1.

The ARE array block 200 according to an embodiment shown in FIG. 5 shows that the information on the row fuse address XFUSE<0:H> is extracted.

The ARE array block 200 of FIG. 5 includes a plurality of fuse set groups. Each fuse set group includes a plurality of fuse sets which are configured by the unit of a mat. The ARE array block 200 selects a corresponding row line according to fuse select information.

Further, the ARE array block 200 stores the address information of a defective cell according to the rupture operation when the rupture control signal R_CON is activated. Each fuse set may be constituted by electrical fuses (E-fuses) which are programmed in such a way as to be melted by overcurrent.

FS<0:R> in the ARE array block 200 represent the number of row fuse sets. Bit<0> is used as the enable bit of a fuse set, a used fuse set is in a cut state, and a non-used fuse set is in a no cut state. Bit<0:H> represent row address bits and store fail information of a fuse set.

In the ARE array block 200, during the boot-up operation, as the counting signals CADD<0:Q> are sequentially generated by the row clock X_CLK, the fuse sets of the ARE array block 200 are accessed. A semiconductor device starts the boot-up operation according to a power-up signal to read the information of the ARE array block 200. Then, bit information of accessed fuse sets is loaded on the row fuse address XFUSE<0:H> and is sequentially outputted to the fuse register 140.

Namely, the ARE array block 200 sequentially performs a read operation from a first fuse set to a last fuse set. If the read operation of the ARE array block 200 is performed, the address information of defective cells stored in the first to last fuse sets is sequentially or simultaneously read.

Bit<0> as the enable bit selectively controls whether or not to input the row fuse address XFUSE<1:H>. For example, when Bit<0> as the enable bit is in a cut state, the row fuse address XFUSE<1:H> may not be stored in the fuse register

140, and, when Bit<0> as the enable bit is in a no cut state, the row fuse address XFUSE<1:H> may be stored in the fuse register 140.

In an embodiment of the disclosure, self-repair is performed using non-used row fuse sets or non-used column fuse sets which are in the ARE array block 200. However, an embodiment of the disclosure is not limited to such, and it is to be noted that row fuse sets or column fuse sets may be provided to be exclusively used for self-repair of a package.

In an embodiment of the disclosure, a repair operation may be performed in such a manner that information on failed banks, failed row addresses, failed column addresses and fuse sets is not generated in the memory in the package state of the memory and instead is directly applied to the memory from an outside.

An operating procedure of the self-repair device in is accordance with an embodiment of the disclosure, configured as mentioned above, will be described below.

In a wafer state, all dies are tested and all fail cells occurred are repaired. Then, after packaging good dies into package assemblies, a package test is performed. At this time, a margin-related fail is likely to occur due to weak refresh or lack of a sensing margin. In order to repair such a fail cell, a memory performs repair by itself, which is referred to as self-repair.

In an embodiment of the disclosure, it is assumed that two cells have failed. According to this fact, the address register 130 includes the two bank address registers 132 and 133, the two row address registers XR0 and XR1, and the two column address registers YR0 and YR1. The fuse register 140 includes the two fuse sets FS<0> and FS<1>.

In an embodiment of the disclosure, since it is assumed that two cells have failed, the above register configuration compares two register data. However, an embodiment of the disclosure is not limited to such, and it is to be noted that the number of registers may be increased or decreased according to the number of fail cells.

First, in the case of entering a specified test mode, an external bank address may be neglected, and all banks of the memory may be activated. Thereafter, data may be written to all cells of the memory, and the data stored in the cells may be read.

If a fail occurs in a certain cell during a read operation, the global input/output lines TGIO<0:G> may transition from a logic high level to a logic low level. Information on the row address XADD or the column address YADD of a failed cell and the fail bank information loaded on the global input/output lines TGIO<0:G> may be latched by the address register 130 according to the control signal PIN.

Then, if an additional fail occurs during the read operation, the global input/output lines TGIO<0:G> may become a logic low level. Information on the row address XADD or the column address YADD of a failed cell and the fail bank information loaded on the global input/output lines TGIO<0:G> may be additionally latched by the address register 130 according to the control signal PIN.

In this process, the address register 130 compares the outputs of the two bank address registers 132 and 133 through the bank address comparator 134. In other words, the bank address of the first failed cell stored in the bank address register 132 and the bank address of the additional failed cell stored in the bank address register 133 are compared with each other, and the bank address BK<0:K> is outputted to the ARE array block 200.

The row address comparator 136 compares the outputs of the two row address registers XR0 and XR1. The row address comparator 136 compares the row addresses of the two failed cells to perform a self-repair operation. The row address comparator 136 outputs the row flag signal SXFG to a logic high level when the two row addresses are the same with each other and outputs the row flag signal SXFG to a logic low level when the two row addresses are different from each other.

Namely, when the row flag signal SXFG is the logic high level, recognition may be made to row-related fails. According to this fact, the row/column redundancy block 300 may perform a repair operation using the row redundancies of the ARE array block 200.

The column address comparator 137 compares the outputs of the two column address registers YR0 and YR1. The column address comparator 137 compares the column addresses of the two failed cells to perform a self-repair operation. The column address comparator 137 outputs the column flag signal SYFG to a logic high level when the two column addresses are the same with each other and outputs the column flag signal SYFG to a logic low level when the two column addresses are different from each other.

Namely, when the column flag signal SYFG is the logic high level, recognition may be made to column-related fails. According to this fact, the row/column redundancy block 300 may perform a repair operation using the column redundancies of the ARE array block 200.

When the row flag signal SXFG or the column flag signal SYFG is the logic low level, recognition may be made to random bit fails. In the case of the random bit fails, the row/column redundancy block 300 may perform a self-repair operation using the row redundancies of the ARE array block 200.

In such an embodiment of the disclosure, address information on two failed bits is compared to determine row-related fails, column-related fails or random bit fails. Repair is performed using row redundancies for the row-related fails, using column redundancies for the column-related fails, and using row redundancies for the random bit fails. By performing the repair operation using appropriate redundancies according to the characteristics of the fails, it is possible to improve a repair success rate in a package state.

Afterwards, when a memory test operation is ended, it may be determined that failed cells are row-related fails, column-related fails or random fails. Further, analysis may be simultaneously completed with regard to information on banks, regions and addresses, to recognize in which regions of the memory the failed cells are disposed.

If the boot-up control signal TBTUP is activated before the memory operates after the power-up operation, the bank address BK, the address ADD, the row flag signal SXFG and the column flag signal SYFG stored in the address register 130 may be outputted to the ARE array block 200, and fuse regions of a corresponding bank may be to selected.

Thereafter, the boot-up control unit 120 activates the row clock X_CLK and the column clock Y_CLK, and outputs the row clock X_CLK and the column clock Y_CLK to the ARE array block 200. The ARE array block 200 searches the selected fuse regions, reads non-used fuse sets, and storage is made to the fuse register 140. Row fuse sets are selected when the row flag signal SXFG is the high level, and column fuse sets are selected when the column flag signal SYFG is the high level. Row fuse sets are selected when both the row flag signal SXFG and the column flag signal SYFG have low levels.

Then, the fuse set information and the fail addresses stored in the fuse register 140 are outputted to the ARE array block 200. If the rupture control signal R_CON is activated, the electrical fuses of the respective address bits of corresponding fuse sets may be ruptured.

A rupture operation is performed once in the case of the row-related or column-related fails. However, in the case of the random bit fails, since the two failed cells have different row and column addresses, a rupture operation should be performed twice. When a failed bit is one, a rupture operation may be performed only once using a row fuse set.

Next, when the self-repair operation is completed, power-up may be restarted (automatic power-up is performed) or rebooting is performed using a trigger signal which is applied from an outside. All information of electrical fuses of the ARE array block 200 may be stored in the row/column redundancy block 300.

By testing the memory again, the failed cells may be confirmed to be repaired, and the memory may be sorted as a good package. Accordingly, it is possible to convert a failed package into a is good package through a self-repair operation.

In such an embodiment of the disclosure, after latching fail addresses by performing a memory test in advance, fuse information on banks and fuse regions may be extracted from the fail addresses. The ARE array block 200 may load information on non-used fuse sets in the fuse regions of the banks corresponding to the fail address information, and store the information in the fuse register 140. By performing a repair operation using the information stored in the fuse register 140, because only a small number of fuse registers are included, a layout area may be reduced.

Figure 6:
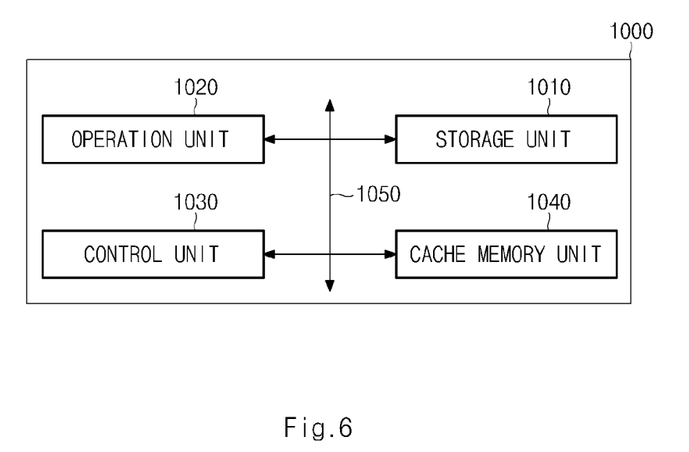
FIG. 6 is a block diagram illustrating a microprocessor according to an embodiment of the invention.

Referring to FIG. 6, a microprocessor 1000 to which the semiconductor device may be applied may control and adjust a series of processes which receive data from various external apparatuses, and process the data and transmit processing results to the external apparatuses. The microprocessor 1000 may include a storage unit 1010, an operation unit 1020, and a control unit 1030. The microprocessor may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 100 and include a data register or address register or other various registers. The storage unit 1010 may temporarily store data to be operated in the operation unit 1020, resulting data is performed in the operation unit 1020, and an address in which data to be operated is stored. The storage unit 1010 may include the semiconductor device described in the embodiments above.

The operation unit 1020 may perform an operation in the microprocessor, and perform a variety of four fundamental rules of an arithmetic operation or a logic operation depending on a decryption result of a command in the control unit 1030. The operation unit may include one or more arithmetic and logic units (ALU).

The control unit 1030 may receive a signal from the storage unit 1010, the operation unit 1020, or an external apparatus of the microprocessor 1000, perform an extraction or decryption of a command, or input or output control, and execute a process in a program form.

The microprocessor 1000 according to an embodiment may further include a cache memory unit 1040 suitable for temporarily storing data input from an external apparatus other than the storage unit 1010 or data to be output to an external apparatus. The cache memory unit 1040 may exchange data from the storage unit 1010, the operation unit 1020, and the control unit 1030 through a bus interface 1050.

While certain embodiments have been described above, it will be understood to those skilled in the art that the embodiments described are by way of example only. Accordingly, the self-repair device described herein should not be limited based on the described embodiments. Rather, the self-repair device described herein should only be limited in light of the claims that follow when taken in conjunction with the above description and accompanying drawings.

What is claimed is:

1. A self-repair device comprising:
   an ARE (array rupture electrical fuse) array block configured to store fail addresses;
   an ARE control block configured to control a repair operation of fuse sets according to the fail addresses, compare addresses of a first failed cell and a second failed cell, and determine a failed state; and
   a redundancy block configured to store fuse data of the fail addresses, compare an input address with the fail addresses, and control row and column redundancy operations.

2. The self-repair device according to claim 1, wherein the ARE control block comprises:
   an address register configured to store fail cell information in the test mode; and
   a fuse register configured to store information on fuse sets of no cut state in the ARE array block, in correspondence to the fail cell information.

3. The self-repair device according to claim 2, wherein the address register stores row addresses, column addresses, and bank information of failed cells.

4. The self-repair device according to claim 2, wherein the address register controls states of flag signals according to a result thereof, and outputs the fail cell information to the ARE array block.

5. The self-repair device according to claim 4, wherein the redundancy block performs a repair operation using column redundancies of the ARE array block by determining column fails when a column flag signal is a logic high level, and performs a repair operation using row redundancies of the ARE array block by determining random bit fails when a row flag signal or the column flag signal is a logic low level.

6. The self-repair device according to claim 2, wherein the address register stores the fail addresses when a control signal is activated, in the case where levels of global input/output lines are a first logic level in the test mode.

7. The self-repair device according to claim 6, wherein the ARE control block further comprises:
   a bank information generator configured to encode information on whether respective banks have failed or not, and output the information to the global input/output lines.

8. The self-repair device according to claim 2, wherein the address register comprises:
   a bank address control section configured to store bank addresses of failed cells when a control signal is activated, compare at least two bank addresses, and output a bank address to the ARE array block; and
   an address control section configured to store the addresses of the failed cells when the control signal is activated, compare at least two addresses, and output a row address or a column address.

9. The self-repair device according to claim 8, wherein the bank address control section comprises:
   a plurality of bank address registers configured to store the bank addresses of the failed cells which are applied from the global input/output lines, according to the control signal; and
   a bank address comparator configured to compare outputs of the plurality of bank address registers, and output the bank address.

10. The self-repair device according to claim 8, wherein the address control section comprises:
   a plurality of row address registers configured to store row addresses of the failed cells which are applied from the global input/output lines, according to the control signal;
   a row address comparator configured to compare outputs of the plurality of row address registers, and output a row comparison signal and a row flag signal;
   a plurality of column address registers configured to store column addresses of the failed cells which are applied from the global input/output lines, according to the control signal;
   a column address comparator configured to compare outputs of the plurality of column address registers, and output a column comparison signal and a column flag signal; and
   a first selector configured to select any one of an output of the row address comparator and an output of the column address comparator according to the row flag signal and the column flag signal, and output an address to the ARE array block.

11. The self-repair device according to claim 10, wherein the first selector selects the row comparison signal and outputs the address when the row flag signal is activated, and selects the column comparison signal and outputs the address when the column flag signal is activated.

12. The self-repair device according to claim 10, wherein the fuse register comprises:
   a second selector configured to select any one of a row fuse address and a column fuse address which are applied from the ARE array block, according to the row flag signal and the column flag signal;
   a fuse set array section configured to store the address outputted from the first selector, and output a plurality of fuse set signals; and
   a third selector configured to select at least one fuse set signal among the plurality of fuse set signals according to a fuse set select signal, and output the selected fuse set signal to the ARE array block.

13. The self-repair device according to claim 1, wherein the ARE control block further comprises:
   a rupture control unit configured to store rupture data according to a rupture signal and a write signal, and output a rupture control signal for controlling a rupture operation to the ARE array block; and
   a boot-up control unit configured to start a boot-up operation according to a boot-up control signal, and output a row clock and a column clock to the ARE array block and the redundancy block according to a counting signal.

14. The self-repair device according to claim 13, wherein the rupture data includes bank information, address information, flag information and fuse set information of failed cells.

15. The self-repair device according to claim 13, wherein the ARE control block further comprises:
   an address counter configured to count the row clock in the boot-up operation, and output the counting signal.

16. The self-repair device according to claim 1, wherein the redundancy block stores in advance bit information of the failed addresses in a test operation at a package level, compares an address inputted in an operation of a memory and the stored bit information of the failed addresses, and performs a redundancy operation.

17. The self-repair device according to claim 13, wherein the ARE array block outputs the fuse data of the fail addresses to the redundancy block, according to the row clock and the column clock applied from the ARE control block.

18. The self-repair device according to claim 17, wherein the ARE array block outputs the fuse data to the redundancy block before the memory operates when a boot-up signal is activated.

19. The self-repair device according to claim 17, wherein the fuse data includes information on ruptured row fuses and information on rupture column fuses.

20. The self-repair device according to claim 1, further comprising:
   a memory tester configured to store information on fail addresses occurred when testing the memory, and output the fail addresses and rupture data to the ARE control block.

21. A self-repair device comprising:
   an ARE (array rupture electrical fuse) control block configured to be inputted with fail address information from a memory tester and control a rupture operation for electrical fuses, compare addresses of a first failed cell and a second failed cell, and determine a failed state;
   an ARE array block configured to store information on respective bits of the fail addresses; and
   a redundancy block configured to perform a redundancy operation in response to a row clock, a column clock, row fuse data, column fuse data, a row address, a column address, and counting signals.

22. The self-repair device according to claim 21, further comprising:
   an address register configured to store information on a bank address, the row address, and the column address corresponding to a fail cell during a testing operation.

23. The self-repair device according to claim 21, further comprising:
   a fuse register configured to read data stored in the ARE array block and load and store information in fuse sets.

24. The self-repair device according to claim 21, wherein the redundancy block is configured to perform a row redundancy operation in response to a row clock and a column redundancy operation in response to a column clock.

25. The self-repair device according to claim 21, wherein the redundancy block is configured to store the row fuse data and the column fuse data of fail addresses before a memory operates.

* * * * *